US 8,489,960 B1

(12) United States Patent
Matache et al.

(10) Patent No.: US 8,489,960 B1
(45) Date of Patent: *Jul. 16, 2013

(54) LDPC CODES AND EXPANSION METHOD

(75) Inventors: Adina Matache, Mountain View, CA (US); Heng Tang, Sunnyvale, CA (US); Gregory Burd, San Jose, CA (US); Aditya Ramamoorthy, Santa Clara, CA (US); Jun Xu, Milpitas, CA (US); Zining Wu, Los Altos, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 13/614,065

(22) Filed: Sep. 13, 2012

Related U.S. Application Data

(63) Continuation of application No. 12/852,817, filed on Aug. 9, 2010, now Pat. No. 8,281,213, which is a continuation of application No. 11/481,141, filed on Jul. 5, 2006, now Pat. No. 7,774,675.

(60) Provisional application No. 60/742,432, filed on Dec. 5, 2005.

(51) Int. Cl.
*H03M 13/00* (2006.01)

(52) U.S. Cl.
USPC ........... 714/755; 714/762; 714/763; 714/786; 714/788; 714/801; 370/206

(58) Field of Classification Search
USPC .................. 714/752, 801, 755, 786, 762, 788, 714/790; 370/206
See application file for complete search history.

(56) References Cited

U.S. PATENT DOCUMENTS

| | | | |
|---|---|---|---|
| 7,774,675 B1 * | 8/2010 | Matache et al. | 714/755 |
| 8,281,213 B1 * | 10/2012 | Matache et al. | 714/755 |
| 2004/0100897 A1 | 5/2004 | Shattil | |
| 2004/0136313 A1 | 7/2004 | Goldstein et al. | |
| 2007/0098094 A1 | 5/2007 | Yue et al. | |
| 2009/0228767 A1 | 9/2009 | Oh et al. | |
| 2009/0259915 A1 | 10/2009 | Livshitz et al. | |

OTHER PUBLICATIONS

Richardson et al; "Efficient Encoding of Low-Density Parity-Check Codes"; IEEE Transactions on Information Theory, vol. 47, No. 2, Feb. 2001; pp. 638-656.
Chugg et al; "A New Class of Turbo-like Codes with Universally Good Performance and High-Speed Decoding"; 5 pages.
Hocevar et al; "A Reduced Complexity Decoder Architecture via Layered Decoding of LDPC Codes"; IEEE 2004; pp. 107-112.
MacKay, David; "Good Error-Correcting Codes based on Very Sparse Matrices"; To Appear in IEEE Transactions on Information Theory, Jan. 1999; 55 pages.
Mansour, Mohammad; "High-Throughput LDPC Decoders"; IEEE Transactions on Very Large Scale Integration Systems, vol. 11, No. 6, Dec. 2003; pp. 976-996.

* cited by examiner

*Primary Examiner* — Guy Lamarre

(57) ABSTRACT

A communications device including a low-density parity check (LDPC) encoder and a transmitter. The LDPC encoder is configured to (i) receive data, and (ii) in response to the received data, generate encoded data using a predetermined LDPC matrix, in which the predetermined LDPC matrix is specified by a predetermined base matrix. The transmitter is configured to transmit the encoded data over a communications channel.

18 Claims, 9 Drawing Sheets

|    |    |    |    |    |    |    |    |    |    |    |    |    |    |    |    |    |    |    |    |    |    |    |    |
|----|----|----|----|----|----|----|----|----|----|----|----|----|----|----|----|----|----|----|----|----|----|----|----|
| 35 | 73 | 19 | -  | 31 | -  | 5  | -  | 19 | -  | -  | 51 | -  | 77 | -  | 27 | 1  | 0  | -  | -  | -  | -  | -  | -  |
| 25 | 66 | 16 | 10 | -  | 51 | -  | 39 | -  | -  | 46 | -  | 3  | -  | 67 | -  | -  | 0  | 0  | -  | -  | -  | -  | -  |
| 27 | 63 | 75 | 52 | 73 | -  | 75 | -  | 62 | 43 | -  | 59 | -  | -  | -  | -  | -  | -  | 0  | 0  | -  | -  | -  | -  |
| 3  | 17 | 1  | 19 | -  | 77 | -  | 11 | -  | -  | 32 | -  | -  | 31 | -  | 19 | -  | -  | -  | 0  | 0  | -  | -  | -  |
| 8  | 29 | 62 | -  | 61 | -  | 36 | -  | 13 | -  | -  | 11 | -  | 1  | -  | -  | 0  | -  | -  | -  | 0  | 0  | -  | -  |
| 69 | 72 | 11 | 76 | -  | 11 | -  | 46 | -  | 29 | -  | 37 | -  | 75 | -  | -  | -  | -  | -  | -  | -  | 0  | 0  | -  |
| 30 | 26 | 9  | 9  | 3  | -  | 63 | -  | 26 | -  | 34 | -  | -  | -  | -  | 65 | -  | -  | -  | -  | -  | -  | 0  | 0  |
| 3  | 7  | 7  | 52 | -  | 6  | -  | 53 | -  | 79 | -  | -  | 0  | -  | 21 | -  | 1  | -  | -  | -  | -  | -  | -  | 0  |

FIG. 2A

|    |    |    |    |    |    |    |    |    |    |    |    |    |    |    |    |    |    |    |    |    |    |    |    |
|----|----|----|----|----|----|----|----|----|----|----|----|----|----|----|----|----|----|----|----|----|----|----|----|
| 54 | 30 | 54 | -  | 71 | -  | 65 | -  | 6  | -  | -  | 46 | -  | 36 | -  | 58 | 1  | 0  | -  | -  | -  | -  | -  | -  |
| 74 | 75 | 37 | 58 | -  | 71 | -  | 21 | -  | -  | 26 | -  | 11 | -  | 64 | -  | -  | 0  | 0  | -  | -  | -  | -  | -  |
| 55 | 74 | 65 | 28 | 47 | -  | 79 | -  | 47 | 21 | -  | 53 | -  | -  | -  | -  | -  | -  | 0  | 0  | -  | -  | -  | -  |
| 54 | 66 | 80 | 69 | -  | 46 | -  | 18 | -  | -  | 80 | -  | -  | 21 | -  | 77 | -  | -  | -  | 0  | 0  | -  | -  | -  |
| 21 | 15 | 45 | -  | 35 | -  | 53 | -  | 77 | -  | -  | 52 | -  | 12 | -  | -  | 0  | -  | -  | -  | 0  | 0  | -  | -  |
| 27 | 18 | 57 | 66 | -  | 35 | -  | 54 | -  | 10 | -  | 64 | -  | 64 | -  | -  | -  | -  | -  | -  | -  | 0  | 0  | -  |
| 35 | 6  | 9  | 65 | 42 | -  | 80 | -  | 13 | -  | 59 | -  | -  | -  | -  | 4  | -  | -  | -  | -  | -  | -  | 0  | 0  |
| 0  | 44 | 69 | 21 | -  | 72 | -  | 68 | -  | 76 | -  | -  | 29 | -  | 29 | -  | 1  | -  | -  | -  | -  | -  | -  | 0  |

FIG. 2B

|    |    |    |    |    |    |    |    |    |    |    |    |    |    |    |    |    |    |    |    |    |    |    |    |
|----|----|----|----|----|----|----|----|----|----|----|----|----|----|----|----|----|----|----|----|----|----|----|----|
| 64 | 8  | 53 | -  | 74 | -  | 55 | -  | 33 | -  | -  | 16 | -  | 23 | -  | 65 | 1  | 0  | -  | -  | -  | -  | -  | -  |
| 71 | 56 | 10 | 55 | -  | 49 | -  | 46 | -  | -  | 3  | -  | 1  | -  | 29 | -  | -  | 0  | 0  | -  | -  | -  | -  | -  |
| 9  | 58 | 11 | 64 | 30 | -  | 70 | -  | 27 | 60 | -  | 77 | -  | -  | -  | -  | -  | -  | 0  | 0  | -  | -  | -  | -  |
| 33 | 79 | 26 | 38 | -  | 10 | -  | 38 | -  | -  | 79 | -  | -  | 79 | -  | 79 | -  | -  | -  | 0  | 0  | -  | -  | -  |
| 59 | 50 | 27 | -  | 42 | -  | 63 | -  | 50 | -  | -  | 75 | -  | 54 | -  | -  | 0  | -  | -  | -  | 0  | 0  | -  | -  |
| 52 | 57 | 61 | 35 | -  | 35 | -  | 50 | -  | 5  | -  | 77 | -  | 71 | -  | -  | -  | -  | -  | -  | -  | 0  | 0  | -  |
| 75 | 77 | 37 | 27 | 46 | -  | 1  | -  | 14 | -  | 26 | -  | -  | -  | -  | 2  | -  | -  | -  | -  | -  | -  | 0  | 0  |
| 46 | 60 | 75 | 60 | -  | 10 | -  | 62 | -  | 79 | -  | -  | 48 | -  | 44 | -  | 1  | -  | -  | -  | -  | -  | -  | 0  |

FIG. 2C

|    |    |    |    |    |    |    |    |    |    |    |    |    |    |    |    |    |    |    |    |    |    |    |    |
|----|----|----|----|----|----|----|----|----|----|----|----|----|----|----|----|----|----|----|----|----|----|----|----|
| 35 | 71 | 56 | 55 | -  | -  | 23 | 34 | -  | -  | -  | 71 | -  | 3  | -  | 72 | 1  | 0  | -  | -  | -  | -  | -  | -  |
| 6  | 48 | 70 | 42 | 30 | -  | 20 | -  | -  | -  | 58 | -  | 14 | -  | -  | 12 | -  | 0  | 0  | -  | -  | -  | -  | -  |
| 13 | 1  | 68 | 59 | 45 | 26 | -  | -  | 55 | -  | -  | 20 | -  | -  | 20 | -  | -  | -  | 0  | 0  | -  | -  | -  | -  |
| 74 | 2  | 61 | 30 | -  | 34 | -  | -  | 36 | -  | 9  | -  | 50 | -  | 46 | -  | -  | -  | -  | 0  | 0  | -  | -  | -  |
| 35 | 15 | 4  | 20 | 57 | -  | 34 | -  | -  | 79 | -  | -  | -  | -  | 30 | -  | 0  | -  | -  | -  | 0  | 0  | -  | -  |
| 40 | 50 | 49 | 14 | 79 | -  | 1  | -  | -  | 12 | 65 | -  | -  | -  | 20 | -  | -  | -  | -  | -  | -  | 0  | 0  | -  |
| 46 | 78 | 78 | 46 | -  | 40 | -  | 80 | 17 | -  | -  | 8  | -  | 6  | -  | -  | -  | -  | -  | -  | -  | -  | 0  | 0  |
| 10 | 22 | 40 | 17 | -  | 48 | -  | 38 | -  | 18 | -  | 72 | -  | 54 | -  | -  | 1  | -  | -  | -  | -  | -  | -  | 0  |

FIG. 2D

| 33 | 62 | 13 | 36 | - | - | 40 | 35 | 33 | - | - | 10 | - | - | 59 | - | 1 | 0 | - | - | - | - | - |
|----|----|----|----|----|----|----|----|----|----|----|----|----|----|----|----|----|----|----|----|----|----|----|
| 72 | 60 | 25 | - | 70 | 62 | - | - | - | - | - | 56 | 79 | 14 | - | 75 | - | 0 | 0 | - | - | - | - |
| 17 | 4 | 52 | 70 | 69 | - | 41 | - | 38 | 5 | 37 | - | - | - | - | - | - | - | 0 | 0 | - | - | - |
| 6 | 53 | 27 | 53 | - | 80 | - | 32 | - | - | 77 | - | - | - | 15 | 48 | - | - | - | 0 | 0 | - | - |
| 62 | 72 | 49 | 19 | - | 71 | 52 | - | 38 | - | - | - | - | 9 | - | - | - | 0 | - | - | 0 | 0 | - |
| 70 | 39 | 60 | - | 46 | - | - | 31 | - | 3 | - | 2 | 40 | 47 | - | - | - | - | - | - | - | 0 | 0 | - |
| 78 | 33 | 3 | 19 | 52 | - | - | - | 51 | - | 39 | - | 43 | - | - | 73 | - | - | - | - | - | - | 0 | 0 |
| 44 | 41 | 39 | 5 | - | 79 | 35 | 21 | - | 24 | - | - | - | - | 73 | - | 1 | - | - | - | - | - | - | 0 |

FIG. 2E

| 52 | 51 | 11 | - | 13 | - | 24 | - | 39 | - | - | 47 | - | 0 | - | 50 | 1 | 0 | - | - | - | - | - |
|----|----|----|----|----|----|----|----|----|----|----|----|----|----|----|----|----|----|----|----|----|----|----|
| 32 | 16 | 43 | 32 | - | 20 | - | 10 | - | - | 19 | - | 25 | - | 23 | - | - | 0 | 0 | - | - | - | - |
| 52 | 8 | 47 | 46 | 30 | - | 48 | - | 32 | 29 | - | 9 | - | - | - | - | - | - | 0 | 0 | - | - | - |
| 2 | 52 | 38 | 49 | - | 10 | - | 7 | - | - | 5 | - | - | 52 | - | 1 | - | - | - | 0 | 0 | - | - |
| 9 | 45 | 29 | - | 38 | - | 8 | - | 48 | - | - | 29 | - | 8 | - | 0 | - | - | - | - | 0 | 0 | - |
| 16 | 38 | 35 | 37 | - | 1 | - | 33 | - | 35 | - | 36 | - | 51 | - | - | - | - | - | - | - | 0 | 0 | - |
| 15 | 40 | 9 | 29 | 24 | - | 21 | - | 46 | - | 21 | - | - | - | - | 51 | - | - | - | - | - | - | 0 | 0 |
| 45 | 53 | 15 | 53 | - | 18 | - | 26 | - | 34 | - | - | 48 | - | 10 | - | 1 | - | - | - | - | - | - | 0 |

FIG. 2F

| 40 | 25 | 36 | - | 39 | - | 0 | - | 6 | - | - | 0 | - | 42 | - | 2 | 1 | 0 | - | - | - | - | - |
|----|----|----|----|----|----|----|----|----|----|----|----|----|----|----|----|----|----|----|----|----|----|----|
| 5 | 36 | 48 | 1 | - | 51 | - | 32 | - | - | 47 | - | 33 | - | 1 | - | - | 0 | 0 | - | - | - | - |
| 19 | 13 | 38 | 27 | 46 | - | 25 | - | 49 | 23 | - | 40 | - | - | - | - | - | - | 0 | 0 | - | - | - |
| 12 | 33 | 48 | 30 | - | 3 | - | 48 | - | - | 38 | - | - | 15 | - | 8 | - | - | - | 0 | 0 | - | - |
| 25 | 18 | 34 | - | 9 | - | 34 | - | 26 | - | - | 11 | - | 29 | - | 0 | - | - | - | - | 0 | 0 | - |
| 35 | 52 | 26 | 40 | - | 17 | - | 25 | - | 48 | - | 42 | - | 17 | - | - | - | - | - | - | - | 0 | 0 | - |
| 1 | 5 | 13 | 43 | 53 | - | 33 | - | 38 | - | 7 | - | - | - | - | 23 | - | - | - | - | - | - | 0 | 0 |
| 44 | 44 | 37 | 20 | - | 0 | - | 25 | - | 36 | - | - | 19 | - | 10 | - | 1 | - | - | - | - | - | - | 0 |

FIG. 2G

| 27 | 39 | 31 | 9 | 15 | - | - | - | 16 | - | 44 | - | 22 | - | 45 | 1 | 0 | - | - | - | - | - |
|----|----|----|----|----|----|----|----|----|----|----|----|----|----|----|----|----|----|----|----|----|----|
| 37 | 35 | 18 | 4 | - | 33 | - | - | 15 | - | 49 | - | 28 | - | 3 | - | - | 0 | 0 | - | - | - | - |
| 16 | 20 | 5 | 15 | 9 | - | - | 31 | - | 26 | - | 49 | - | 19 | - | - | - | - | 0 | 0 | - | - | - |
| 7 | 33 | 10 | 30 | 41 | - | 45 | - | 46 | - | 52 | - | - | - | - | 45 | - | - | - | 0 | 0 | - | - |
| 29 | 2 | 12 | 46 | - | 39 | - | 29 | - | - | - | 0 | - | 28 | - | 0 | - | - | - | - | 0 | 0 | - |
| 12 | 35 | 39 | 44 | 31 | - | 24 | - | - | 9 | - | 16 | - | 14 | - | - | - | - | - | - | - | 0 | 0 | - |
| 10 | 17 | 18 | 13 | 21 | - | 16 | - | 22 | - | 33 | - | - | - | - | 52 | - | - | - | - | - | - | 0 | 0 |
| 34 | 2 | 19 | 31 | 4 | 2 | - | 51 | - | - | - | 21 | - | 6 | - | 1 | - | - | - | - | - | - | 0 |

FIG. 2H

| 11 | 19 | 12 | 10 | 13 | - | - | - | 44 | - | 32 | - | 40 | - | 34 | 1 | 0 | - | - | - | - | - | - |
|---|---|---|---|---|---|---|---|---|---|---|---|---|---|---|---|---|---|---|---|---|---|---|
| 17 | 44 | 15 | 23 | - | 18 | - | - | 19 | - | 2 | - | 2 | - | 1 | - | - | 0 | 0 | - | - | - | - |
| 38 | 8 | 51 | 8 | 41 | - | - | 10 | - | 50 | - | 26 | - | 5 | - | - | - | - | 0 | 0 | - | - | - |
| 13 | 41 | 19 | 3 | 44 | - | 32 | - | 27 | - | 44 | - | - | - | 52 | - | - | - | 0 | 0 | - | - | - |
| 3 | 26 | 8 | 24 | - | 20 | - | 31 | - | - | - | 46 | - | 31 | - | 0 | - | - | - | 0 | 0 | - | - |
| 5 | 1 | 30 | 44 | 53 | - | 20 | - | - | 39 | - | 48 | - | 32 | - | - | - | - | - | - | 0 | 0 | - |
| 51 | 41 | 47 | 6 | 21 | - | 40 | - | 36 | - | 4 | - | - | - | - | 23 | - | - | - | - | - | 0 | 0 |
| 13 | 18 | 8 | 41 | 24 | 17 | - | 52 | - | - | - | - | 4 | - | 20 | - | 1 | - | - | - | - | - | 0 |

FIG. 2I

| 11 | 39 | 22 | - | 37 | - | 4 | - | 16 | - | - | 6 | - | 6 | - | 46 | 1 | 0 | - | - | - | - | - |
|---|---|---|---|---|---|---|---|---|---|---|---|---|---|---|---|---|---|---|---|---|---|---|
| 6 | 31 | 31 | 2 | - | 35 | - | 22 | - | - | 39 | - | 48 | - | 24 | - | - | 0 | 0 | - | - | - | - |
| 32 | 1 | 14 | 19 | 21 | - | 41 | - | 6 | 14 | - | 14 | - | - | - | - | - | - | 0 | 0 | - | - | - |
| 38 | 8 | 35 | 15 | - | 25 | - | 2 | - | - | 45 | - | - | 0 | - | 35 | - | - | - | 0 | 0 | - | - |
| 4 | 7 | 22 | - | 43 | - | 33 | - | 10 | - | - | - | 47 | - | 32 | - | 0 | - | - | - | 0 | 0 | - |
| 12 | 5 | 41 | 28 | - | 4 | - | 11 | - | 53 | - | 44 | - | 47 | - | - | - | - | - | - | - | 0 | 0 |
| 50 | 0 | 12 | 5 | 25 | - | 2 | - | 51 | - | 49 | - | - | - | 4 | - | - | - | - | - | - | 0 | 0 |
| 26 | 14 | 32 | 48 | - | 41 | - | 0 | - | 26 | - | - | 24 | - | 19 | - | 1 | - | - | - | - | - | 0 |

FIG. 2J

| 14 | 10 | 49 | 47 | 23 | - | 33 | - | - | - | 40 | - | 1 | - | 38 | 1 | 0 | - | - | - | - | - | - |
|---|---|---|---|---|---|---|---|---|---|---|---|---|---|---|---|---|---|---|---|---|---|---|
| 47 | 35 | 33 | 53 | - | 25 | - | - | 44 | - | 34 | - | 16 | - | 31 | - | - | 0 | 0 | - | - | - | - |
| 25 | 9 | 51 | 12 | 44 | - | 7 | 51 | - | 51 | - | 8 | - | - | - | - | - | - | 0 | 0 | - | - | - |
| 28 | 38 | 8 | 45 | - | 7 | - | - | 15 | - | 10 | - | - | 2 | - | 32 | - | - | - | 0 | 0 | - | - |
| 19 | 12 | 43 | 38 | 13 | - | 49 | - | - | - | - | 13 | - | 45 | - | 0 | - | - | - | 0 | 0 | - | - |
| 7 | 9 | 46 | 33 | - | 48 | - | 1 | - | 24 | - | 13 | - | 15 | - | - | - | - | - | - | - | 0 | 0 |
| 16 | 53 | 32 | 1 | 48 | - | 45 | - | 19 | - | 6 | - | - | - | - | 48 | - | - | - | - | - | 0 | 0 |
| 15 | 47 | 13 | 51 | - | 27 | - | 38 | - | 47 | - | - | 6 | - | 7 | - | 1 | - | - | - | - | - | 0 |

FIG. 2K

| 12 | 18 | 8 | 15 | 19 | - | 20 | - | - | - | - | 1 | - | 1 | - | 1 | 1 | 0 | - | - | - | - | - |
|---|---|---|---|---|---|---|---|---|---|---|---|---|---|---|---|---|---|---|---|---|---|---|
| 7 | 0 | 12 | 6 | - | 13 | - | - | 22 | - | 23 | - | 11 | - | 19 | - | - | 0 | 0 | - | - | - | - |
| 9 | 22 | 16 | 13 | 9 | - | 7 | 8 | - | 18 | - | 7 | - | - | - | - | - | - | 0 | 0 | - | - | - |
| 12 | 10 | 6 | 12 | - | 9 | - | - | 7 | - | 25 | - | - | 14 | - | 21 | - | - | - | 0 | 0 | - | - |
| 25 | 9 | 11 | 19 | 24 | - | 3 | - | - | - | - | 4 | - | 21 | - | 0 | - | - | - | 0 | 0 | - | - |
| 9 | 12 | 20 | 2 | - | 8 | - | 2 | - | 5 | - | 20 | - | 19 | - | - | - | - | - | - | - | 0 | 0 |
| 13 | 14 | 2 | 15 | 16 | - | 24 | - | 13 | - | 15 | - | - | - | - | 21 | - | - | - | - | - | 0 | 0 |
| 5 | 26 | 6 | 11 | - | 24 | - | 26 | - | 6 | - | - | 7 | - | 9 | - | 1 | - | - | - | - | - | 0 |

FIG. 2L

| 25 | 26 | 14 | -  | 20 | -  | 2  | -  | 4  | -  | -  | 8  | -  | 16 | -  | 18 | 1 | 0 | - | - | - | - | - |
|----|----|----|----|----|----|----|----|----|----|----|----|----|----|----|----|---|---|---|---|---|---|---|
| 10 | 9  | 15 | 11 | -  | 0  | -  | 1  | -  | -  | 18 | -  | 8  | -  | 10 | -  | - | 0 | 0 | - | - | - | - |
| 16 | 2  | 20 | 26 | 21 | -  | 6  | -  | 1  | 26 | -  | 7  | -  | -  | -  | -  | - | - | 0 | 0 | - | - | - |
| 10 | 13 | 5  | 0  | -  | 3  | -  | 7  | -  | -  | 26 | -  | -  | 13 | -  | 16 | - | - | - | 0 | 0 | - | - |
| 23 | 14 | 24 | -  | 12 | -  | 19 | -  | 17 | -  | -  | -  | 20 | -  | 21 | -  | 0 | - | - | - | 0 | 0 | - |
| 6  | 22 | 9  | 20 | -  | 25 | -  | 17 | -  | 8  | -  | 14 | -  | 18 | -  | -  | - | - | - | - | - | 0 | 0 | - |
| 14 | 23 | 21 | 11 | 20 | -  | 24 | -  | 18 | -  | 19 | -  | -  | -  | -  | 22 | - | - | - | - | - | - | 0 | 0 |
| 17 | 11 | 11 | 20 | -  | 21 | -  | 26 | -  | 3  | -  | -  | 18 | -  | 26 | -  | 1 | - | - | - | - | - | - | 0 |

FIG. 2M

| 3  | 6  | 9  | -  | 21 | -  | 6  | -  | 7  | -  | -  | 17 | -  | 10 | -  | 20 | 1 | 0 | - | - | - | - | - |
|----|----|----|----|----|----|----|----|----|----|----|----|----|----|----|----|---|---|---|---|---|---|---|
| 20 | 25 | 15 | 24 | -  | 0  | -  | 23 | -  | -  | 18 | -  | 22 | -  | 26 | -  | - | 0 | 0 | - | - | - | - |
| 11 | 21 | 16 | 26 | 19 | -  | 26 | -  | 25 | 16 | -  | 20 | -  | -  | -  | -  | - | - | 0 | 0 | - | - | - |
| 3  | 17 | 1  | 8  | -  | 20 | -  | 4  | -  | -  | 24 | -  | -  | 14 | -  | 6  | - | - | - | 0 | 0 | - | - |
| 13 | 2  | 15 | -  | 23 | -  | 22 | -  | 22 | -  | -  | -  | 25 | -  | 8  | -  | 0 | - | - | - | 0 | 0 | - |
| 22 | 4  | 19 | 5  | -  | 23 | -  | 20 | -  | 10 | -  | 25 | -  | 0  | -  | -  | - | - | - | - | - | 0 | 0 | - |
| 5  | 26 | 17 | 11 | 1  | -  | 21 | -  | 4  | -  | 1  | -  | -  | -  | -  | 26 | - | - | - | - | - | - | 0 | 0 |
| 0  | 12 | 20 | 18 | -  | 20 | -  | 18 | -  | 25 | -  | -  | 18 | -  | 16 | -  | 1 | - | - | - | - | - | - | 0 |

FIG. 2N

| 24 | 10 | 1  | 15 | 22 | -  | 26 | -  | -  | -  | -  | 26 | -  | 20 | -  | 12 | 1 | 0 | - | - | - | - | - |
|----|----|----|----|----|----|----|----|----|----|----|----|----|----|----|----|---|---|---|---|---|---|---|
| 8  | 12 | 19 | 0  | -  | 2  | -  | -  | 15 | -  | 21 | -  | 3  | -  | 20 | -  | - | 0 | 0 | - | - | - | - |
| 25 | 26 | 1  | 2  | 12 | -  | 1  | 13 | -  | 0  | -  | 8  | -  | -  | -  | -  | - | - | 0 | 0 | - | - | - |
| 3  | 6  | 5  | 12 | -  | 5  | -  | -  | 23 | -  | 9  | -  | -  | -  | 15 | -  | 17 | - | - | 0 | 0 | - | - |
| 1  | 10 | 2  | 8  | 24 | -  | 20 | -  | -  | -  | -  | 21 | -  | 15 | -  | 0  | - | - | - | 0 | 0 | - | - |
| 12 | 20 | 21 | 20 | -  | 11 | -  | 16 | -  | 8  | -  | 10 | -  | 20 | -  | -  | - | - | - | - | - | 0 | 0 | - |
| 20 | 3  | 20 | 14 | 12 | -  | 10 | -  | 10 | -  | 14 | -  | -  | -  | 13 | -  | - | - | - | - | - | - | 0 | 0 |
| 16 | 1  | 5  | 5  | -  | 1  | -  | 23 | -  | 6  | -  | -  | 1  | -  | 0  | -  | 1 | - | - | - | - | - | - | 0 |

FIG. 2O

LDPC CODES AND EXPANSION METHOD

CROSS-REFERENCE TO RELATED APPLICATIONS

This application is a continuation U.S. patent application Ser. No. 12/852,817, filed Aug. 9, 2010, which is a continuation of U.S. patent application Ser. No. 11/481,141 (now U.S. Pat. No. 7,774,675), filed Jul. 5, 2006, which claims the benefit of U.S. Provisional Application No. 60/742,432, filed Dec. 5, 2005. The entire disclosures of the above applications are incorporated herein by reference.

FIELD OF THE INVENTION

The present invention relates to error control coding, and more specifically to low density parity check codes.

BACKGROUND OF THE INVENTION

The draft standard of IEEE 802.11n (Enhanced Wireless Consortium, PHY specification, Revision V1.28, Jan. 2, 2006), which is incorporated herein by reference in its entirety, specifies a MIMO (multiple-input multiple-output) OFDM (orthogonal frequency-division multiplexing) system. Referring now to FIG. 1, a functional block diagram of an exemplary implementation of an 802.11n transmitter is depicted. The transmitter includes a scrambler 104, which receives user data to be transmitted. The scrambler 104 scrambles the data to prevent long sequences of zeros or ones, and communicates with an encoder parser 106. The encoder parser 106 demultiplexes the scrambled bits among a number, $N_{ES}$, of FEC (forward error correction) encoders 108. $N_{ES}$, the number of encoding streams, is two in the example of FIG. 1.

The FEC encoders 108 encode the data to enable error correction, and may include a binary convolutional encoder followed by a puncturing device, or an LDPC (low density parity check) encoder. Implementing convolutional codes is mandatory, while LDPC codes are optional as a high-performance ECC (error correcting code) technique. When the LDPC codes are used, the number of FEC encoders is one ($N_{ES}=1$). The FEC encoders 108 communicate with a stream parser 110, which divides the output of the FEC encoders 108 into blocks that will be sent to different interleaver 112 and mapping 114 devices. The blocks going to a particular interleaver 112 are referred to as a spatial stream.

The stream parser 110 communicates with a number, $N_{SS}$, of interleavers 112. $N_{SS}$, the number of spatial streams, is four in the example of FIG. 1. The interleavers 112 interleave the bits of each spatial stream by changing order of the bits to prevent long sequences of adjacent noisy bits entering the FEC decoder. Each interleaver communicates with one of $N_{SS}$ number of QAM (quadrature amplitude modulation) mapping modules 114. The QAM mapping modules 114 map the sequence of bits in each spatial stream to constellation points (in the complex number plane). The QAM mapping modules 114 optionally communicate with a STBC (space time block coding) module 116. The STBC module 116 spreads constellation points from $N_{SS}$ spatial streams into $N_{STS}$ (where $N_{STS}>N_{SS}$) space time streams using a space time block code.

The STBC module 116 communicates with a number, $N_{STS}-1$, of cyclic shift modules 118, and with a spatial mapping module 120. $N_{STS}$, the number of space time streams, is four in the example of FIG. 1. The cyclic shift modules 118 insert cyclic shift into blocks in the frequency domain as part of spatial expansion when optional spatial mapping is implemented. The cyclic shift modules 118 communicate with the spatial mapping module 120. The spatial mapping module 120 maps spatial streams to different transmit chains. This may include: direct mapping each sequence of constellation points to a different transmit chain; spatial expansion, where each vector of constellation points from all sequences is multiplied by a matrix to produce input to the transmit chains; and/or beam forming, where each vector of constellation points from all sequences is multiplied by a matrix of steering vectors to produce input to the transmit chains.

The spatial mapping module 120 communicates with a number, $N_{TX}$, of IFFT (inverse fast Fourier transform) modules 122. $N_{TX}$, the number of transmit chains, is four in the example of FIG. 1. Each IFFT module 122 converts a block of constellation points into a time domain block. All but one of the IFFT modules 122 communicates with a corresponding cyclic shift insertion module 124. The one IFFT module 122 that does not communicate with one of the cyclic shift insertion modules 124 communicates with a GI/window module 126. The cyclic shift insertion modules 124 insert cyclic shift into the time domain blocks, and communicate with GI/window modules 126. The GI/window modules 126 insert guard intervals and optionally smooth the edges of each symbol to increase spectral decay. The GI/window modules 126 communicate with analog/RF modules 128, which up convert the complex baseband waveform to an RF signal and transmit.

SUMMARY OF THE INVENTION

A MIMO transmitter comprises a scrambler; an encoder parser responsive to the scrambler; a forward error correction encoder responsive to the encoder parser, wherein the encoder applies a parity check matrix derived from a base matrix; an interleaver responsive to the forward error correction encoder; a QAM mapping module responsive to the interleaver; an inverse fast Fourier transform module responsive to the QAM mapping module; and an output module responsive to the inverse fast Fourier transform module.

A MIMO transmitter comprises a scrambler and a forward error correction encoder responsive to the scrambler, wherein the encoder applies a parity check matrix derived from a base matrix. In other features, the MIMO transmitter further comprises an encoder parser responsive to the scrambler, wherein the forward error correction encoder is responsive to the encoder parser; an interleaver responsive to the forward error correction encoder; a QAM mapping module responsive to the interleaver; an inverse fast Fourier transform module responsive to the QAM mapping module; and an output module responsive to the inverse fast Fourier transform module.

A method of encoding data comprises receiving data blocks; deriving a parity check matrix from a base matrix; and encoding each of said data blocks based upon said parity check matrix. A computer program executed by a processor comprises receiving data blocks; deriving a parity check matrix from a base matrix; and encoding each of said data blocks based upon said parity check matrix.

A computer program stored for use by a processor for encoding data comprises receiving data blocks; deriving a parity check matrix from a base matrix; and encoding each of said data blocks based upon said parity check matrix. A computer program executed by a processor comprises receiving data blocks; deriving a parity check matrix from a base matrix; and encoding each of said data blocks based upon said parity check matrix.

A MIMO transmitter comprises scrambling means for preventing consecutive sequences; encoder parsing means responsive to the scrambling means for demultiplexing scrambled information; forward error correction (FEC) encoding means responsive to the encoder parsing means for applying a parity check matrix derived from a base matrix; interleaving means responsive to the FEC encoding means for preventing sequences of adjacent noisy bits; QAM mapping means responsive to the interleaving means for mapping bits to constellation points; inverse fast Fourier transformation means responsive to the QAM mapping means for converting constellation information to time domain; and output means responsive to the inverse fast Fourier transformation means for outputting time domain information.

A low density parity check coding (LDPC) system comprises data generating means for providing data in blocks; LDPC encoding means for encoding each of said blocks based upon a parity check matrix derived from a base matrix. A MIMO transmitter comprises scrambling means for preventing consecutive sequences; and forward error correction (FEC) encoding means responsive to the scrambling means for applying a parity check matrix derived from a base matrix.

In other features, the MIMO transmitter further comprises encoder parsing means responsive to the scrambling means for demultiplexing scrambled information; interleaving means responsive to the FEC encoding means for preventing sequences of adjacent noisy bits; QAM mapping means responsive to the interleaving means for mapping bits to constellation points; inverse fast Fourier transformation means responsive to the QAM mapping means for converting constellation information to time domain; and output means responsive to the inverse fast Fourier transformation means for outputting time domain information.

In other features, the base matrix referred to above is one of the following:

In still other features, the methods described above are implemented by a computer program executed by one or more processors. The computer program can reside on a computer readable medium such as but not limited to memory, non-volatile data storage and/or other suitable tangible storage mediums.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 2A is a rate-2/3 base matrix for a LDPC code with block size (n) of 1944;

FIG. 2B is another rate-2/3 base matrix for a LDPC code with n=1944;

FIG. 2C is another rate-2/3 base matrix for a LDPC code with n=1944;

FIG. 2D is another rate-2/3 base matrix for a LDPC code with n=1944;

FIG. 2E is another rate-2/3 base matrix for a LDPC code with n=1944;

FIG. 2F is a rate-2/3 base matrix for a LDPC code with n=1296;

FIG. 2G is another rate-2/3 base matrix for a LDPC code with n=1296;

Figure 1:
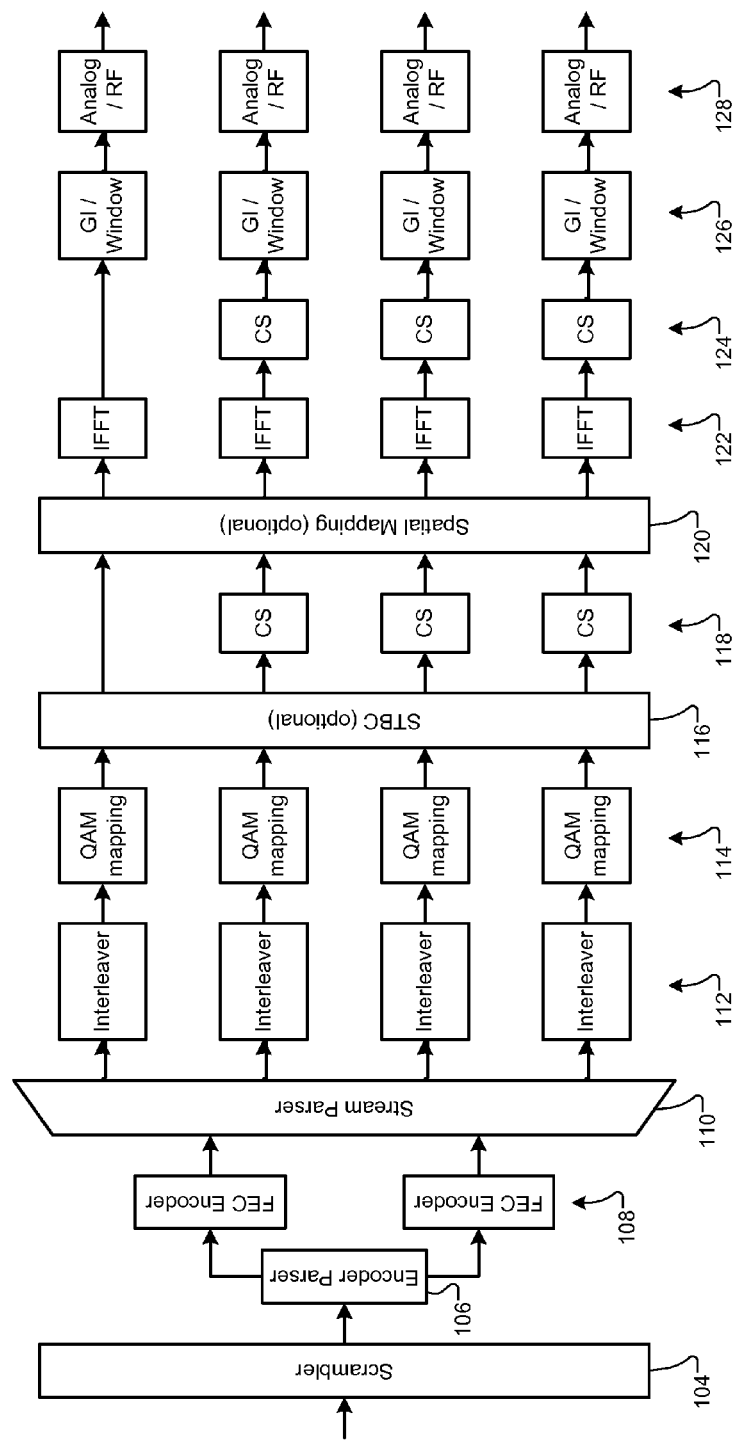
FIG. 1 is a functional block diagram of an exemplary implementation of an 802.11n transmitter.

| 35 | 71 | 56 | 55 | — | — | 23 | 34 | — | — | — | 71 | — | 3  | — | 72 | 1 | 0 | — | — | — | — | — | — |
|----|----|----|----|---|---|----|----|---|---|---|----|---|----|---|----|---|---|---|---|---|---|---|---|
| 6  | 48 | 70 | 42 | 30| — | 20 | — | — | — | 58| —  | 14| —  | — | 12 | — | 0 | 0 | — | — | — | — | — |
| 13 | 1  | 68 | 59 | 45| 26| —  | — | 55| — | — | —  | 20| —  | — | 20 | — | — | 0 | 0 | — | — | — | — |
| 74 | 2  | 61 | 30 | — | 34| —  | — | 36| — | 9 | —  | 50| —  | 46| —  | — | — | — | 0 | 0 | — | — | — |
| 35 | 15 | 4  | 20 | 57| — | 34 | — | — | 79| — | —  | — | —  | 30| —  | 0 | — | — | — | 0 | 0 | — | — |
| 40 | 50 | 49 | 14 | 79| — | 1  | — | — | 12| 65| —  | — | —  | 20| —  | — | — | — | — | — | 0 | 0 | — |
| 46 | 78 | 78 | 46 | — | 40| —  | 80| 17| — | — | 8  | — | 6  | — | —  | — | — | — | — | — | — | 0 | 0 |
| 10 | 22 | 40 | 17 | — | 48| —  | 38| — | 18| — | 72 | — | 54 | — | —  | 1 | — | — | — | — | — | — | 0 |

| 14 | 10 | 49 | 47 | 23| — | 33 | — | — | — | — | 40 | — | 1  | — | 38 | 1 | 0 | — | — | — | — | — | — |
| 47 | 35 | 33 | 53 | — | 25| —  | — | 44| — | 34| —  | 16| —  | 31| —  | — | 0 | 0 | — | — | — | — | — |
| 25 | 9  | 51 | 12 | 44| — | 7  | 51| — | 51| — | 8  | — | —  | — | —  | — | — | 0 | 0 | — | — | — | — |
| 28 | 38 | 8  | 45 | — | 7 | —  | — | 15| — | 10| —  | — | 2  | — | 32 | — | — | — | 0 | 0 | — | — | — |
| 19 | 12 | 43 | 38 | 13| — | 49 | — | — | — | — | 13 | — | 45 | — | —  | 0 | — | — | — | 0 | 0 | — | — |
| 7  | 9  | 46 | 33 | — | 48| —  | 1 | — | 24| — | 13 | — | 15 | — | —  | — | — | — | — | — | 0 | 0 | — |
| 16 | 53 | 32 | 1  | 48| — | 45 | — | 19| — | 6 | —  | — | —  | — | 48 | — | — | — | — | — | — | 0 | 0 |
| 15 | 47 | 13 | 51 | — | 27| —  | 38| — | 47| — | —  | 6 | —  | 7 | —  | 1 | — | — | — | — | — | — | 0 |

| 25 | 26 | 14 | — | 20| — | 2 | — | 4 | — | — | 8 | — | 16| — | 18 | 1 | 0 | — | — | — | — | — | — |
| 10 | 9  | 15 | 11| — | 0 | — | 1 | — | — | 18| — | 8 | — | 10| —  | — | 0 | 0 | — | — | — | — | — |
| 16 | 2  | 20 | 26| 21| — | 6 | — | 1 | 26| — | 7 | — | — | — | —  | — | — | 0 | 0 | — | — | — | — |
| 10 | 13 | 5  | 0 | — | 3 | — | 7 | — | — | 26| — | 13| — | 16| —  | — | — | — | 0 | 0 | — | — | — |
| 23 | 14 | 24 | — | 12| — | 19| — | 17| — | — | 20| — | 21| — | —  | 0 | — | — | — | 0 | 0 | — | — |
| 6  | 22 | 9  | 20| — | 25| — | 17| — | 8 | — | 14| — | 18| — | —  | — | — | — | — | — | 0 | 0 | — |
| 14 | 23 | 21 | 11| 20| — | 24| — | 18| — | 19| — | — | — | — | 22 | — | — | — | — | — | — | 0 | 0 |
| 17 | 11 | 11 | 20| — | 21| — | 26| — | 3 | — | — | 18| — | 26| —  | 1 | — | — | — | — | — | — | 0 |

Figure 3:
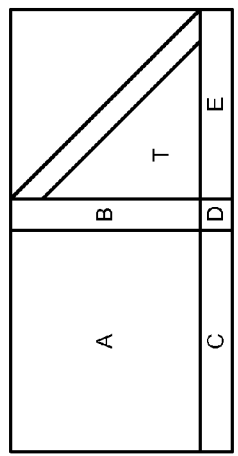
Figure 4:
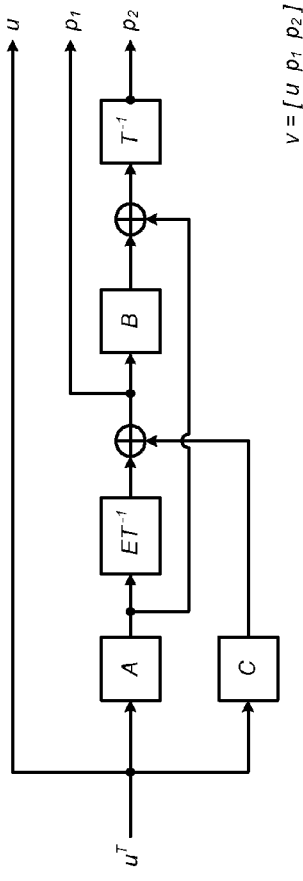
Figure 5:
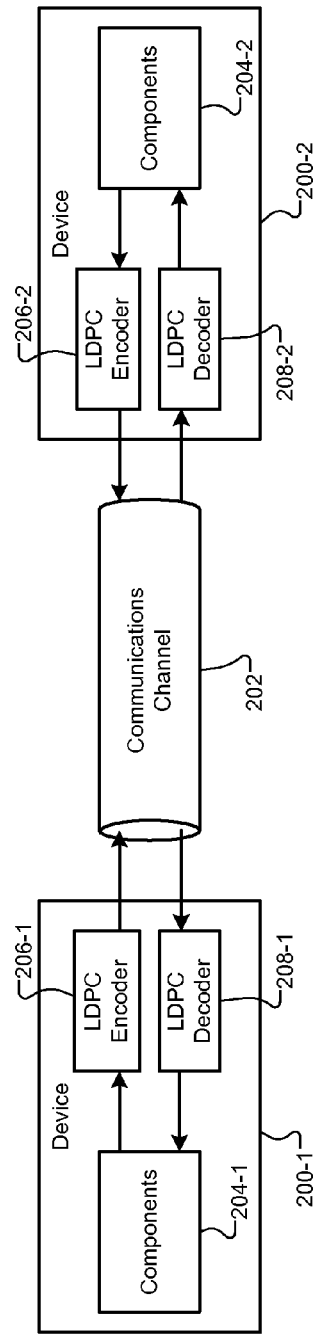
Figure 6A:
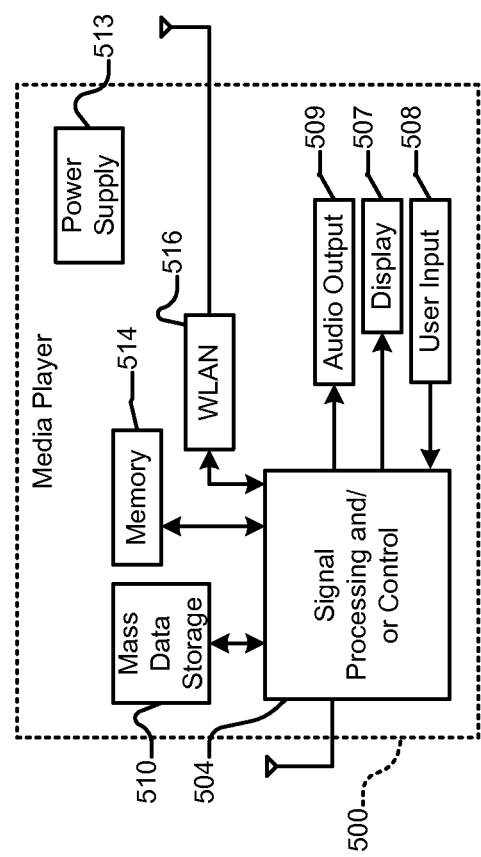
Figure 6C:
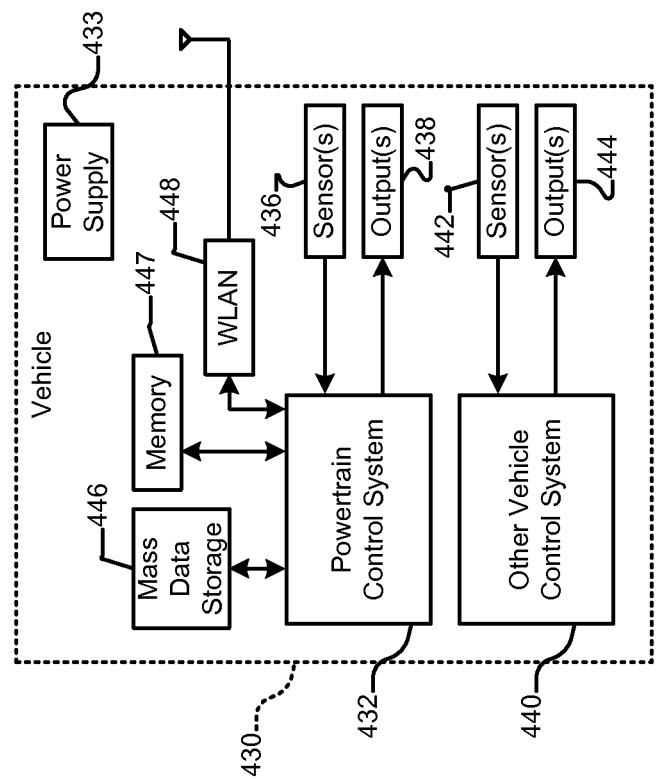
Figure 6B:
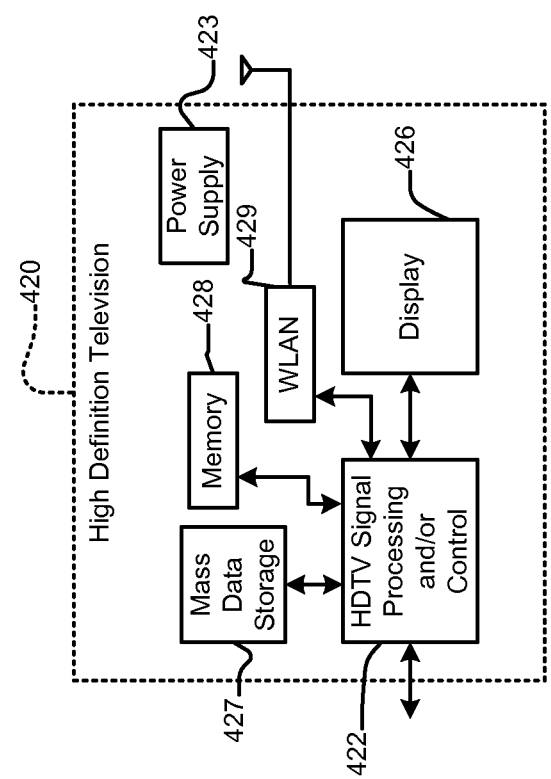
Figure 6D:
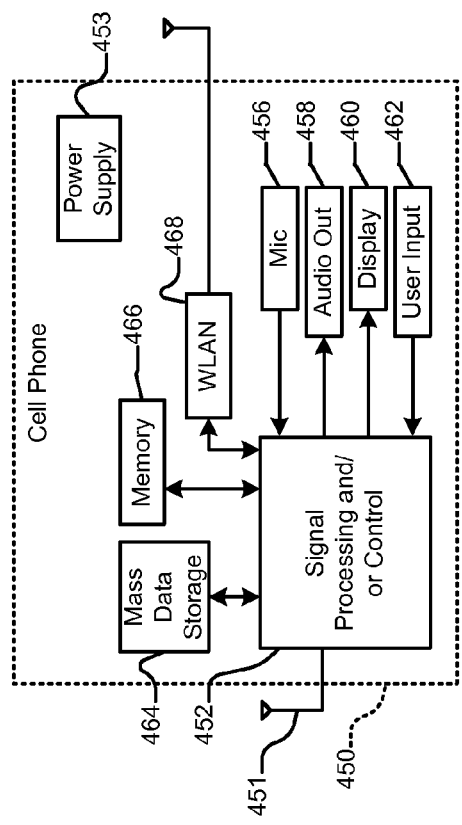

FIG. 2H is another rate-2/3 base matrix for a LDPC code with n=1296;

FIG. 2I is another rate-2/3 base matrix for a LDPC code with n=1296;

FIG. 2J is another rate-2/3 base matrix for a LDPC code with n=1296;

FIG. 2K is another rate-2/3 base matrix for a LDPC code with n=1296;

FIG. 2L is a rate-2/3 base matrix for a LDPC code with n=648;

FIG. 2M is another rate-2/3 base matrix for a LDPC code with n=648;

FIG. 2N is another rate-2/3 base matrix for a LDPC code with n=648;

FIG. 2O is another rate-2/3 base matrix for a LDPC code with n=648;

FIG. 3 is a graphical representation of the division of a matrix into sub-matrices according to the Richardson-Urbanke method;

FIG. 4 is a graphical representation of how the codeword c is formed using computed values according to the Richardson-Urbanke method;

FIG. 5 is a functional block diagram of an exemplary communications channel;

FIG. 6A is a functional block diagram of a media player;

FIG. 6B is a functional block diagram of a high definition television;

FIG. 6C is a functional block diagram of a vehicle control system;

FIG. 6D is a functional block diagram of a cellular phone; and

Figure 6E:
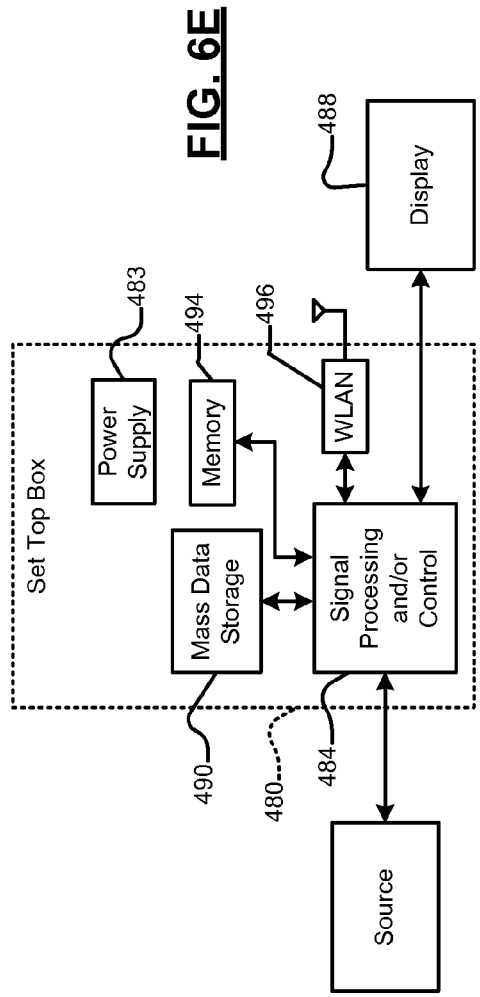

FIG. 6E is a functional block diagram of a set top box.

DETAILED DESCRIPTION OF THE PREFERRED EMBODIMENTS

The following description of the preferred embodiments is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present invention.

Low-density parity check (LDPC) codes form a class of error correcting code that approaches the Shannon limit. LDPC codes are linear block codes specified by a sparse parity-check matrix H of size (n−k)×n, where n is the codeword length and k is the number of user bits within the codeword. Codeword block lengths include 648, 1296, and 1944. For each codeword block length, supported code rates include 1/2, 2/3, 3/4, and 5/6. Code rate is determined by the number of user bits contained within every block of transmitted bits, and is equal to k/n.

Much of the analysis of LDPC codes is based on their graph representations. For LDPC codes to perform well, cycles of length 4 are usually avoided in their graph representations. A cycle of length 4 in graph representations translates to the following in parity matrix representations:

$$\begin{matrix} 1 & \ldots & 1 \\ \cdot & & \cdot \\ \cdot & & \cdot \\ \cdot & & \cdot \\ 1 & \ldots & 1 \end{matrix}$$

Eliminating the cycle of length 4 in graph representations is equivalent to forcing the following constraint to parity matrix representations: no two columns/rows can have more than one "1" in common. Codes proposed below (FIGS. 2A-2O) meet the above constraint.

Parity check matrices H are generated by expanding a base matrix $H_b$ z times. Expansion operation is defined by the element values of the base matrix $H_b$. Each non-empty base matrix element having value i is replaced by a z×z cyclic-permutation matrix $P_i$. $P_i$ is obtained from the z×z identity matrix by cyclically shifting the columns to the right by i elements. Each vacant entry (denoted by a "-") in the base matrix is replaced by a z×z zero matrix.

Proposed LDPC codes belong to the more general class of quasi-cyclic LDPC codes. Proposed LDPC codes are rate-2/3 codes, with codeword block lengths of 648, 1296, and 1944 bits. The base matrices are of size 8×24 (8 rows, 24 columns). The expansion factors are z=27 for n=648 (24*27); z=54 for 1296 (24*54); and z=81 for n=1944 (24*81). The total weight (number of non-zero entries in the matrix) of each base matrix is 88. The row weight (number of non-zero entries in a row) is 11 for all rows.

Referring now to FIG. 2A, a rate-2/3 base matrix for a LDPC code with block size (n) of 1944 is presented. Matrix elements denoted by "-" are empty, and therefore expanded using a zero matrix. FIG. 2B presents another rate-2/3 base matrix for a LDPC code with n=1944. FIG. 2C presents another rate-2/3 base matrix for a LDPC code with n=1944. FIG. 2D presents another rate-2/3 base matrix for a LDPC code with n=1944. FIG. 2E presents another rate-2/3 base matrix for a LDPC code with n=1944.

FIG. 2F presents a rate-2/3 base matrix for a LDPC code with n=1296.

FIG. 2G presents another rate-2/3 base matrix for a LDPC code with n=1296. FIG. 2H presents another rate-2/3 base matrix for a LDPC code with n=1296. FIG. 2I presents another rate-2/3 base matrix for a LDPC code with n=1296. FIG. 2J presents another rate-2/3 base matrix for a LDPC code with n=1296. FIG. 2K presents another rate-2/3 base matrix for a LDPC code with n=1296.

FIG. 2L presents a rate-2/3 base matrix for a LDPC code with n=648. FIG. 2M presents another rate-2/3 base matrix for a LDPC code with n=648. FIG. 2N presents another rate-2/3 base matrix for a LDPC code with n=648. FIG. 2O presents another rate-2/3 base matrix for a LDPC code with n=648.

An encoder for LDPC codes is systematic, which means that it encodes an information block of size k, $u=[u_0, u_1, \ldots, u_{k-1}]$, into a codeword c of size n, $c=[u_0, u_1, \ldots u_{k-1}, p_0, p_1, \ldots, p_{n-k-1}]$, by adding n−k parity bits. Parity bits are obtained such that $H \cdot c^T = 0$. In general, encoding a linear block code is done via the generator matrix G, i.e., $c = u \cdot G$, where G satisfies $GH^T = 0$.

The generator matrix G is obtained using the following derivation:

$$H \cdot c^T = [H_1 \mid H_2] \cdot \begin{bmatrix} u^T \\ p^T \end{bmatrix} = 0$$

$$\Downarrow$$

$$H_1 \cdot u^T = H_2 \cdot p^T$$

$$\Downarrow$$

$$c = [u \; p] = u \cdot \underbrace{\left[ I \; (H_2^{-1} \cdot H_1)^T \right]}_{G}$$

Encoding methods having reduced complexity are available for LDPC codes having the structure of the matrices proposed in FIGS. 2A-2O. One such example is block based backward-substitution. Another is Richardson-Urbanke encoding. See T. Richardson and R. Urbanke, "Efficient encoding of low-density parity-check codes," IEEE Trans. on Inform. Theory, Vol. 47, February 2001, which is incorporated herein by reference in its entirety.

In Richardson-Urbanke encoding, the parity check matrix is divided into 6 sub-matrices. FIG. 3 is a graphical representation of the division of a matrix into sub-matrices according to the Richardson-Urbanke method. The shift value at the middle of B is 0 and the top value of B and D have the same values. The rightmost shift value of E is 0 and the other sub-matrices are zero matrices. For example, $B^T = [P \; 0 \; 0 \ldots 0 \; I \; 0 \ldots 0 \; 0 \; I]$, $D = [P]$, and $E = [0 \; 0 \ldots 0 \; 0 \; I]$. Therefore, $ET^{-1} = [I \; I \ldots I \; I \; I]$. FIG. 4 is a graphical representation of how the codeword c is formed using computed values of $p_1$ and $p_2$. Computation proceeds as follows:

Step 1: Compute $Au^T$ and $Cu^T$
Step 2: Compute $ET^{-1}(Au^T)$
Step 3: Compute $p_1^T$ by $p_1^T = ET^{-1}(Au^T) + Cu^T$
Step 4: Compute $p_2^T$ by $Tp_2^T = Au^T + Bp_1^T$ For decoding, the most common decoding algorithm is the standard belief propagation algorithm (BPA), or sum-product algorithm (SPA), which passes messages on the bipartite (Tanner) graph associated with the parity check matrix. See D. J. C. MacKay, "Good error-correcting codes based on very sparse matrices," IEEE Trans. Inform. Theory, Vol. 45, March 1999, which is incorporated herein by reference in its entirety. For the class of quasi-cyclic codes, the "turbo decoding message-passing" algorithm is available. See M. Mansour and N. Shanbhag, "High-Throughput LDPC Decoders," IEEE Trans. On VLSI Systems, Vol. 11, No. 6, December 2003, which is incorporated herein by reference in its entirety. Also available is the "layered belief propagation" algorithm. See D. Hocevar, "A reduced complexity decoder architecture via layered decoding of LDPC Codes," IEEE Workshop on Signal Proc. Systems (SIPS), October 2004, which is incorporated herein by reference in its entirety.

LDPC codes can also be viewed as equivalent General-Repeat-Accumulate (GRA) codes, which support turbo-like decoding. See K. M. Chugg, P. Thiennviboon, G. D. Dimou, P. Gray, and J. Melzer, "A New Class of Turbo-like Codes with Universally Good Performance and High-Speed Decoding," Proc. IEEE Military Comm. Conf. 2005, which is incorporated herein by reference in its entirety.

In standard belief propagation, messages are exchanged between variable nodes (associated with information bits) and check nodes (associated with parity check bits) in an iterative fashion. Each iteration consists of 2 phases of computations: in phase 1, updates of all variable nodes are done by sending messages to neighboring check nodes; in phase 2, updates of all check nodes are done by sending messages to neighboring bit nodes. This process continues until a codeword is found or the maximum number of iterations is reached.

Referring now to FIG. 5, a first device 200-1 communicates with a second device 200-2 over a communications channel 202. The communications channel 202 may be, for example, an Ethernet network, a wireless local area network, a bus for a hard drive, etc. The communications channel 202 may represent a storage media (such as a hard drive), in which case there would be no second device 200-2. Instead, the communications channel would store data from the first device 200-1 (e.g., the read/write head and channel of a hard drive) and later provide the data to the first device 200-1.

The first device 200-1 includes components 204-1 that output signals to a LDPC (low density parity check) encoder 206-1 and that receive signals from a LDPC decoder 208-1. Likewise, the second device 200-2 includes components 204-2 that output signals to a LDPC encoder 206-2 and that receive signals from a LDPC decoder 208-2. The components 204-1 of the first device 200-1 may be similar to or different than the components 204-2 of the second device 200-2. The LDPC encoders 216 encode data before the encoded data is output onto the communications channel 202. The encoding process adds redundant information to the data stream that may allow the LDPC decoders 218 to possibly detect and correct errors in the received data. In the case where the communications channel 202 is a compact disc, the first device 200-1 (such as a CD recording device) would not need a LDPC decoder 208-1 and the second device 200-2 (such as a CD player) would not need a LDPC encoder 206-2. The LDPC matrices proposed in FIGS. 2A-2O may be used in the LDPC encoders 206 and decoders 208.

Referring now to FIGS. 6A-6E, various exemplary implementations of the device are shown. Referring now to FIG. 6A, the device can be implemented in a communications channel of a media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. The signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via a WLAN network interface 516. Still other implementations in addition to those described above are contemplated.

Referring now to FIG. 6B, the device can be implemented in a communications channel of a high definition television (HDTV) 420. The HDTV 420 receives HDTV input signals in either a wired or wireless format and generates HDTV output signals for a display 426. In some implementations, signal processing circuit and/or control circuit 422 and/or other circuits (not shown) of the HDTV 420 may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via a WLAN network interface 429.

Referring now to FIG. 6C, the device may implement and/or be implemented in a communications channel of a control system of a vehicle 430. In some implementations, the device implement a powertrain control system 432 that receives inputs from one or more sensors such as temperature sensors, pressure sensors, rotational sensors, airflow sensors and/or any other suitable sensors and/or that generates one or more output control signals such as engine operating parameters, transmission operating parameters, and/or other control signals.

The device may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via a WLAN network interface 448. The control system 440 may also include mass data storage, memory and/or a WLAN interface (all not shown).

Referring now to FIG. 6D, the device can be implemented in a communications channel of a cellular phone 450 that may include a cellular antenna 451. In some implementations, the cellular phone 450 includes a microphone 456, an audio output 458 such as a speaker and/or audio output jack, a display 460 and/or an input device 462 such as a keypad, pointing device, voice actuation and/or other input device. The signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via a WLAN network interface 468.

Referring now to FIG. 6E, the device can be implemented in a communications channel of a set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via a WLAN network interface 496.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, the specification and the following claims.

What is claimed is:

1. A communications device, comprising:
    a low-density parity check (LDPC) encoder configured to (i) receive data, and (ii) in response to the received data, generate encoded data using a predetermined LDPC matrix,
    wherein the predetermined LDPC matrix is specified by a predetermined base matrix, and
    wherein the predetermined base matrix is:

| 35 | 71 | 56 | 55 | —  | —  | 23 | 34 | —  | —  | —  | 71 |
|----|----|----|----|----|----|----|----|----|----|----|----|
| 6  | 48 | 70 | 42 | 30 | —  | 20 | —  | —  | —  | 58 | —  |
| 13 | 1  | 68 | 59 | 45 | 26 | —  | —  | 55 | —  | —  | —  |
| 74 | 2  | 61 | 30 | —  | 34 | —  | —  | 36 | —  | 9  | —  |
| 35 | 15 | 4  | 20 | 57 | —  | 34 | —  | —  | 79 | —  | —  |
| 40 | 50 | 49 | 14 | 79 | —  | 1  | —  | —  | 12 | 65 | —  |
| 46 | 78 | 78 | 46 | —  | 40 | —  | 80 | 17 | —  | —  | 8  |
| 10 | 22 | 40 | 17 | —  | 48 | —  | 38 | —  | 18 | —  | 72 |
| —  | 3  | —  | 72 | 1  | 0  | —  | —  | —  | —  | —  | —  |
| 14 | —  | —  | 12 | —  | 0  | 0  | —  | —  | —  | —  | —  |
| 20 | —  | —  | 20 | —  | —  | 0  | 0  | —  | —  | —  | —  |
| 50 | —  | 46 | —  | —  | —  | —  | 0  | 0  | —  | —  | —  |
| —  | —  | 30 | —  | 0  | —  | —  | —  | 0  | 0  | —  | —  |
| —  | —  | 20 | —  | —  | —  | —  | —  | —  | 0  | 0  | —  |

-continued

| | | | | | | | | | | | |
|---|---|---|---|---|---|---|---|---|---|---|---|
| — | 6 | — | — | — | — | — | — | — | — | 0 | 0 |
| — | 54 | — | — | 1 | — | — | — | — | — | — | 0; | and a transmitter configured to transmit the encoded data over a communications channel.

2. The communications device of claim 1, further comprising a scrambler configured to (i) generate scrambled data, and (ii) output the scrambled data to the LDPC encoder.

3. The communications device of claim 2, further comprising:
  a plurality of forward error correction encoders, wherein one of the plurality of forward error correction encoders includes the LDPC encoder; and
  an encoder parser configured to demultiplex the scrambled data among the plurality of forward error correction encoders.

4. The communications device of claim 1, further comprising:
  a quadrature amplitude modulation mapping module configured to generate constellation points in response to the encoded data; and
  an inverse fast Fourier transform module configured to generate time domain blocks in response to the constellation points,
  wherein the transmitter is configured to transmit the encoded data in response to the time domain blocks.

5. The communications device of claim 4, further comprising an interleaver configured to interleave bits of the encoded data prior to processing of the encoded data by the quadrature amplitude modulation mapping module.

6. A multiple-input multiple-output (MIMO) transmitter system comprising the communications device of claim 1.

7. A communications device, comprising:
  a low-density parity check (LDPC) encoder configured to (i) receive data, and (ii) in response to the received data, generate encoded data using a predetermined LDPC matrix,
  wherein the predetermined LDPC matrix is specified by a predetermined base matrix, and
  wherein the predetermined base matrix is:

and a transmitter configured to transmit the encoded data over a communications channel.

8. The communications device of claim 7, further comprising a scrambler configured to (i) generate scrambled data, and (ii) output the scrambled data to the LDPC encoder.

9. The communications device of claim 8, further comprising:
  a plurality of forward error correction encoders, wherein one of the plurality of forward error correction encoders includes the LDPC encoder; and
  an encoder parser configured to demultiplex the scrambled data among the plurality of forward error correction encoders.

10. The communications device of claim 7, further comprising:
  a quadrature amplitude modulation mapping module configured to generate constellation points in response to the encoded data; and
  an inverse fast Fourier transform module configured to generate time domain blocks in response to the constellation points,
  wherein the transmitter is configured to transmit the encoded data in response to the time domain blocks.

11. The communications device of claim 10, further comprising an interleaver configured to interleave bits of the encoded data prior to processing of the encoded data by the quadrature amplitude modulation mapping module.

12. A multiple-input multiple-output (MIMO) transmitter system comprising the communications device of claim 7.

13. A communications device, comprising:
  a low-density parity check (LDPC) encoder configured to (i) receive data, and (ii) in response to the received data, generate encoded data using a predetermined LDPC matrix,
  wherein the predetermined LDPC matrix is specified by a predetermined base matrix, and

| | | | | | | | | | | | | | | | | | | | | | | | |
|---|---|---|---|---|---|---|---|---|---|---|---|---|---|---|---|---|---|---|---|---|---|---|---|
| 14 | 10 | 49 | 47 | 23 | — | 33 | — | — | — | — | 40 | — | 1 | — | 38 | 1 | 0 | — | — | — | — | — | — |
| 47 | 35 | 33 | 53 | — | 25 | — | — | 44 | — | 34 | — | 16 | — | 31 | — | — | 0 | 0 | — | — | — | — | — |
| 25 | 9 | 51 | 12 | 44 | — | 7 | 51 | — | 51 | — | 8 | — | — | — | — | — | — | 0 | 0 | — | — | — | — |
| 28 | 38 | 8 | 45 | — | 7 | — | — | 15 | — | 10 | — | — | 2 | — | 32 | — | — | — | 0 | 0 | — | — | — |
| 19 | 12 | 43 | 38 | 13 | — | 49 | — | — | — | — | — | 13 | — | 45 | — | 0 | — | — | — | 0 | 0 | — | — |
| 7 | 9 | 46 | 33 | — | 48 | — | 1 | — | 24 | — | 13 | — | 15 | — | — | — | — | — | — | — | 0 | 0 | — |
| 16 | 53 | 32 | 1 | 48 | — | 45 | — | 19 | — | 6 | — | — | — | — | 48 | — | — | — | — | — | — | 0 | 0 |
| 15 | 47 | 13 | 51 | — | 27 | — | 38 | — | 47 | — | — | 6 | — | 7 | — | 1 | — | — | — | — | — | — | 0; | wherein the predetermined base matrix is:

| 25 | 26 | 14 | —  | 20 | —  | 2  | —  | 4  | —  | —  | 8  | —  | 16 | —  | 18 | 1  | 0  | —  | —  | —  | —  | —  | —  |
|----|----|----|----|----|----|----|----|----|----|----|----|----|----|----|----|----|----|----|----|----|----|----|----|
| 10 | 9  | 15 | 11 | —  | 0  | —  | 1  | —  | —  | 18 | —  | 8  | —  | 10 | —  | —  | 0  | 0  | —  | —  | —  | —  | —  |
| 16 | 2  | 20 | 26 | 21 | —  | 6  | —  | 1  | 26 | —  | 7  | —  | —  | —  | —  | —  | —  | 0  | 0  | —  | —  | —  | —  |
| 10 | 13 | 5  | 0  | —  | 3  | —  | 7  | —  | —  | 26 | —  | —  | 13 | —  | 16 | —  | —  | —  | 0  | 0  | —  | —  | —  |
| 23 | 14 | 24 | —  | 12 | —  | 19 | —  | 17 | —  | —  | —  | 20 | —  | 21 | —  | 0  | —  | —  | —  | 0  | 0  | —  | —  |
| 6  | 22 | 9  | 20 | —  | 25 | —  | 17 | —  | 8  | —  | 14 | —  | 18 | —  | —  | —  | —  | —  | —  | —  | 0  | 0  | —  |
| 14 | 23 | 21 | 11 | 20 | —  | 24 | —  | 18 | —  | 19 | —  | —  | —  | —  | 22 | —  | —  | —  | —  | —  | —  | 0  | 0  |
| 17 | 11 | 11 | 20 | —  | 21 | —  | 26 | —  | 3  | —  | —  | 18 | —  | 26 | —  | 1  | —  | —  | —  | —  | —  | —  | 0; | and
- a transmitter configured to transmit the encoded data over a communications channel.

14. The communications device of claim 13, further comprising a scrambler configured to (i) generate scrambled data, and (ii) output the scrambled data to the LDPC encoder.

15. The communications device of claim 14, further comprising:
- a plurality of forward error correction encoders, wherein one of the plurality of forward error correction encoders includes the LDPC encoder; and
- an encoder parser configured to demultiplex the scrambled data among the plurality of forward error correction encoders.

16. The communications device of claim 13, further comprising:
- a quadrature amplitude modulation mapping module configured to generate constellation points in response to the encoded data; and
- an inverse fast Fourier transform module configured to generate time domain blocks in response to the constellation points,
- wherein the transmitter is configured to transmit the encoded data in response to the time domain blocks.

17. The communications device of claim 16, further comprising an interleaver configured to interleave bits of the encoded data prior to processing of the encoded data by the quadrature amplitude modulation mapping module.

18. A multiple-input multiple-output (MIMO) transmitter system comprising the communications device of claim 13.

* * * * *